United States Patent
Wang et al.

(10) Patent No.: US 8,698,065 B2
(45) Date of Patent: Apr. 15, 2014

(54) PHOTO SENSING MODULE HAVING PROTECTION FUNCTION AND DISPLAY DEVICE

(75) Inventors: Wen-Chun Wang, Taichung (TW);
Po-Hsien Wang, Taichung (TW);
Chih-Chang Lai, Taichung (TW);
Hsi-Rong Han, Taichung (TW)

(73) Assignee: Wintek Corporation, Taichung (TW)

( * ) Notice: Subject to any disclaimer, the term of this patent is extended or adjusted under 35 U.S.C. 154(b) by 1076 days.

(21) Appl. No.: 12/717,465

(22) Filed: Mar. 4, 2010

(65) Prior Publication Data
US 2010/0225629 A1    Sep. 9, 2010

(30) Foreign Application Priority Data

Mar. 5, 2009  (TW) .................................. 9810757 A

(51) Int. Cl.
*G02F 1/1343*   (2006.01)
(52) U.S. Cl.
USPC ........................................ 250/214 R; 349/59
(58) Field of Classification Search
USPC ...... 250/214 R, 216, 237 R, 239; 349/40, 59, 349/111, 141; 345/207
See application file for complete search history.

(56) References Cited

U.S. PATENT DOCUMENTS

| | | | |
|---|---|---|---|
| 4,670,347 A | 6/1987 | Lasik et al. | |
| 5,831,693 A | 11/1998 | McCartney, Jr. et al. | |
| 6,467,972 B2 | 10/2002 | Setoguchi | |
| 6,665,023 B1 * | 12/2003 | Watanabe et al. | 349/38 |
| 7,053,967 B2 | 5/2006 | Abileah et al. | |
| 2004/0113877 A1 | 6/2004 | Abileah et al. | |
| 2008/0049004 A1 | 2/2008 | Kunimori et al. | |
| 2008/0297466 A1 | 12/2008 | Kunimori et al. | |
| 2008/0303022 A1 | 12/2008 | Tai et al. | |
| 2011/0291126 A1 * | 12/2011 | Nakahara et al. | 257/88 |

FOREIGN PATENT DOCUMENTS

| | | |
|---|---|---|
| CN | 101105616 | 1/2008 |
| TW | 200849575 | 12/2008 |
| TW | 200903080 | 1/2009 |

* cited by examiner

*Primary Examiner* — Kevin Pyo
(74) *Attorney, Agent, or Firm* — Muncy, Geissler, Olds & Lowe, P.C.

(57) ABSTRACT

A photo sensing module is provided on a first substrate and includes a photo sensing device and a protection wiring. A gap exists between the photo sensing module and an external circuit, and the photo sensing device is provided on the first substrate. The protection wiring is electrically-conductive and located between the external circuit and at least a portion of the photo sensing device.

10 Claims, 6 Drawing Sheets

PHOTO SENSING MODULE HAVING PROTECTION FUNCTION AND DISPLAY DEVICE

BACKGROUND OF THE INVENTION (a) Field of the Invention

The invention relates to a photo sensing module and a display device, particularly to a photo sensing module and a display device having a protection function.

(b) Description of the Related Art

Conventionally, an ambient light sensor is provided on a display device to measure the ambient light intensity so as to adjust the brightness of the light source of the display device. Thereby, fine display effect and reduced power consumption are provided. U.S. Pat. No. 5,831,693 discloses an integrated light sensor for an active matrix liquid crystal display (AM LCD) panel, where the light sensor is formed around the active matrix substrate through thin-film processes, and light signals are converted to electric signals by an operational amplifier to adjust the brightness of a light source. U.S. Pat. No. 7,053,967 discloses another display device with a light sensor, where the light sensor senses the ambient light intensity and the display device adjusts the luminance of its light-emitting element according to the ambient light intensity. Since a display device having a light sensor adjusts the brightness of a light source according to the measurement of the light sensor, if such measurement fluctuates or is inaccurate, the light source of the display device may flicker to thereby affect the display quality of the display device.

BRIEF SUMMARY OF THE INVENTION

One object of the invention is to provide a photo sensing module having a protection function to prevent the sensing result of the photo sensing device from being affected by circuits adjacent to the photo sensing device of the photo sensing module. Another object of the invention is to provide a display device comprising a photo sensing module, where the photo sensing device of the photo sensing module provides more accurate or stable sensing results to increase the display quality of the display device.

According to one embodiment of the invention, a photo sensing module having a protection function is provided on a first substrate. A gap exists between the photo sensing module and an external circuit. The photo sensing module comprises a photo sensing device and a protection wiring. The photo sensing device is provided on the first substrate. The protection wiring is electrically-conductive and provided between the external circuit and one portion of the photo sensing device.

According to another embodiment of the invention, a display device comprises a first circuit, a first substrate, a photo sensing device, and a protection wiring. The photo sensing device is provided on the first substrate, and a space exists between the photo sensing device and a first circuit. The protection wiring is electrically-conductive and provided between the first circuit and one portion of the photo sensing device.

According to one embodiment of the invention, the photo sensing device comprises a photo sensor and a photo sensing signal line coupled to the photo sensor. The protection wiring is provided between an external circuit (first circuit) and the photo sensor or between the external circuit (first circuit) and the photo sensing signal line. Preferably, the protection wiring is provided on the first substrate and surrounds at least one of the photo sensor and the photo sensing signal line.

According to one embodiment of the invention, the first substrate faces a second substrate, an external circuit (first circuit) is provided on the second substrate, and the protection wiring is provided on a portion of the photo sensing device. Preferably, the protection wiring comprises an electrically-conductive wiring and a second insulation layer, and the second insulation layer is provided between the electrically-conductive wiring and the portion of the photo sensing device. The electrically-conductive wiring may be a metallic layer or an indium tin oxide layer.

According to one embodiment of the invention, the display device further comprises a driver provided on the first substrate and coupled to the first circuit and the photo sensing device. Preferably, the protection wiring is coupled to a ground of the driver.

According to one embodiment of the invention, the display device further comprises a first insulation layer and a second circuit. The second circuit is provided on the first substrate and crosses the photo sensing signal line via the first insulation layer to form an overlapping region. The thickness of the first insulation layer in the overlapping region is between 5000 Å and 6000 Å.

According to one embodiment of the invention, the first substrate is an active matrix substrate, the second substrate is a color filter substrate, and the first circuit is a common electrode. Preferably, the portion of the photo sensing device forms an orthogonal projection region on the color filter substrate, and the orthogonal projection region is not overlapped with the common electrode.

By the design of each embodiment of the invention, the protection wiring is electrically-conductive and located between the photo sensing device and the external circuit (first circuit) of the photo sensing device, so that the protection wiring has shielding effect to reduce the interference due to the external circuit (first circuit) on the photo sensing device, and that the sensing results are more precise and more stable. Therefore, the display device according to one embodiment of the invention can provide appropriate brightness and is hard to show flickering so as to increase the display quality.

DETAILED DESCRIPTION OF THE INVENTION

The following will describe the design of the photo sensor according to the embodiments of the invention with reference to the related drawings where the same element is denoted by the same symbol. Besides, The phrase "a layer A is formed on a layer B" recited in this specification is not limited to the meaning that the layer A directly covers and touches the surface of the layer B. For example, it may also include the meaning that another layer is interposed between the layer A and the layer B.

Figure 1:
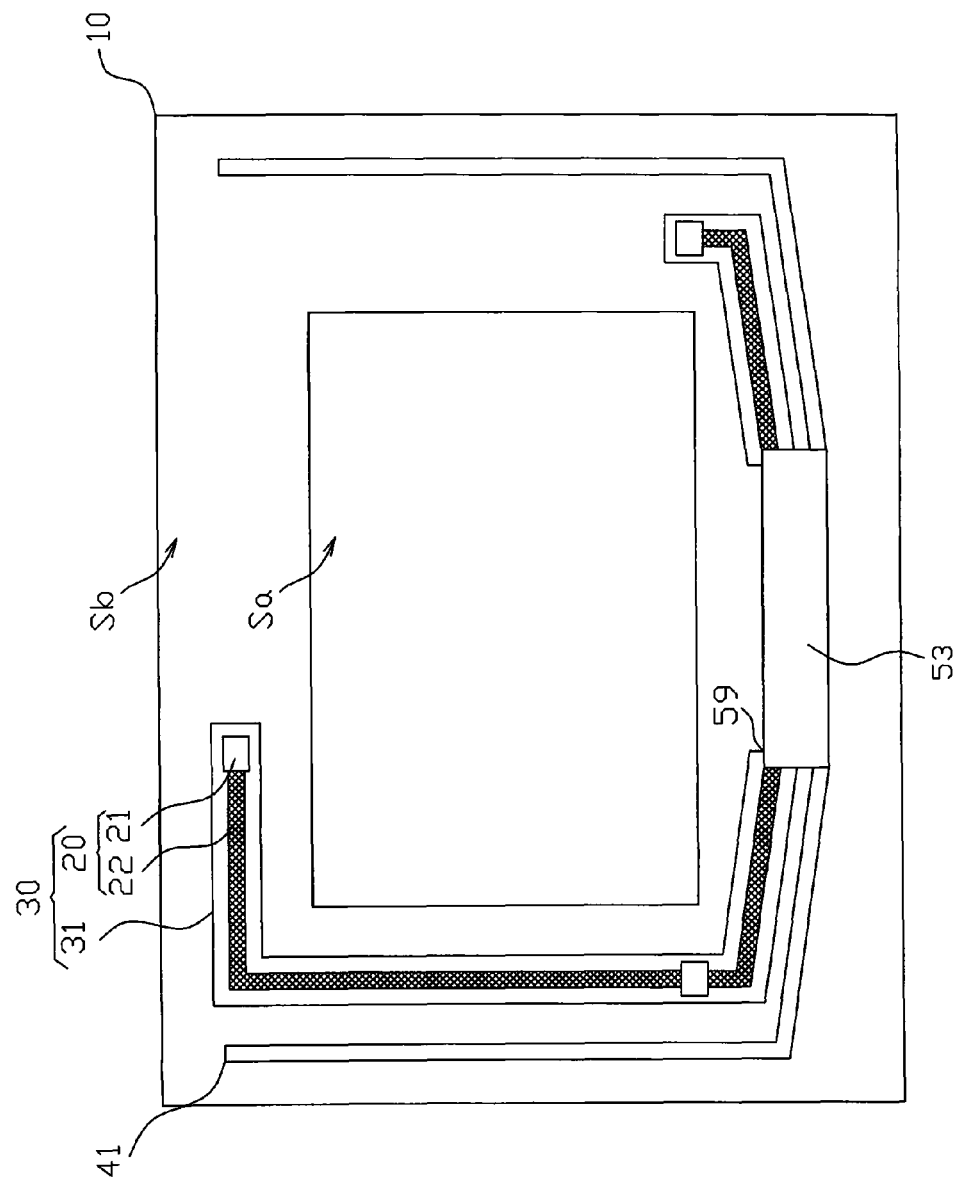
FIG. 1 shows a top-view illustrating a substrate of the display device according to one embodiment of the invention.

FIG. 1 shows a top-view illustrating a substrate of the display device according to one embodiment of the invention. The display device according to the embodiment comprises an active matrix substrate 10, a color filter substrate (not shown) facing the active matrix substrate, and a liquid crystal layer between the active matrix substrate 10 and the color filter substrate. Referring to FIG. 1, a photo sensing module 30 is provided on, but not limited to, the active matrix substrate 10. In another embodiment, the photo sensing module 30 may be provided on the color filter substrate (not shown). Such modification and change should be accomplished by those who are skilled in the art according to the following description, thus not explained in detail here. The photo sensing module 30 has a noise interference protection function, and a gap exists between the photo sensing module 30 and a first circuit of the display device. In addition, the photo sensing module 30 comprises a photo sensing device 20 and a protection wiring 31. In this embodiment, the first circuit may be a first common wiring 41 provided on the active matrix substrate 10, and the first common wiring 41 is coupled to a common electrode (Vcom electrode) or is grounded. The photo sensing device 20 is provided on the active matrix substrate 10 and comprises a photo sensor 21 and a photo sensing signal line 22 coupled to the photo sensor 21. The protection wiring 31 is electrically-conductive and surrounds the photo sensing device 20 to isolate the photo sensing device 20 from unnecessary interfering signals, such as interfering signals from the first common wiring 41, thus providing shielding effect.

In other words, since the photo sensing device 20 is a sensitive element, the photo sensing device 20 tends to be easily interfered by other circuit adjacent to the photo sensing device 20 (such as the first common wiring 41) to thereby affect the precision of sensing results. Also, momentary fluctuations due to the interference of other circuit may affect the stability of the sensing results. Therefore, according to this embodiment, the protection wiring 31 can reduce the interference from the first common wiring 41 and imposed on the photo sensing device 20, so that the photo sensing device 20 may obtain more precise and stable sensing results. Therefore, when the display device correspondingly adjusts the brightness of the light source according to the ambient light intensity measured by the photo sensing device 20, the display device is allowed to provide more appropriate stable luminance to thereby improve the display quality. The material of the protection wiring 31 is not limited, as long as the material is electrically-conductive to provide shielding effect. The material of the protection wiring 31 may be a metallic layer or an indium tin oxide layer. The protection wiring 31 is grounded or coupled to a constant DC voltage. Besides, the layout of the protection wiring 31 in this embodiment is not limited to surrounding the entire photo sensing device 20. Even only a portion of the photo sensing device 20 is surrounded by the protection wiring 31, the shielding effect is also obtained.

The display device may further comprise a driver 53 provided on the active matrix substrate 10 for driving the pixel circuit (not shown) on the active matrix substrate 10. The photo sensing device 20 is coupled to the driver 53 so that the driver 53 can adjust the brightness of the display device according to sensing results of the photo sensing device 20. Preferably, the two terminals of the protection wiring 31 are also coupled to one ground terminal 59 of the driver 53. The protection wiring 31 is grounded through the ground terminal 59 of the driver 53 to reduce an additional ground circuit provided on the active matrix substrate 10 for the protection wiring 31. Thus, the circuit layout on the active matrix substrate 10 is allowed to be simplified. Besides, the active matrix substrate 10 may be divided into an active display region Sa and a non-active display region Sb. The first common wiring 41 is provided in the non-active display region Sb. In this embodiment, the photo sensing device 20 and the protection wiring 31 are provided in the non-active display region Sb.

Figure 2:
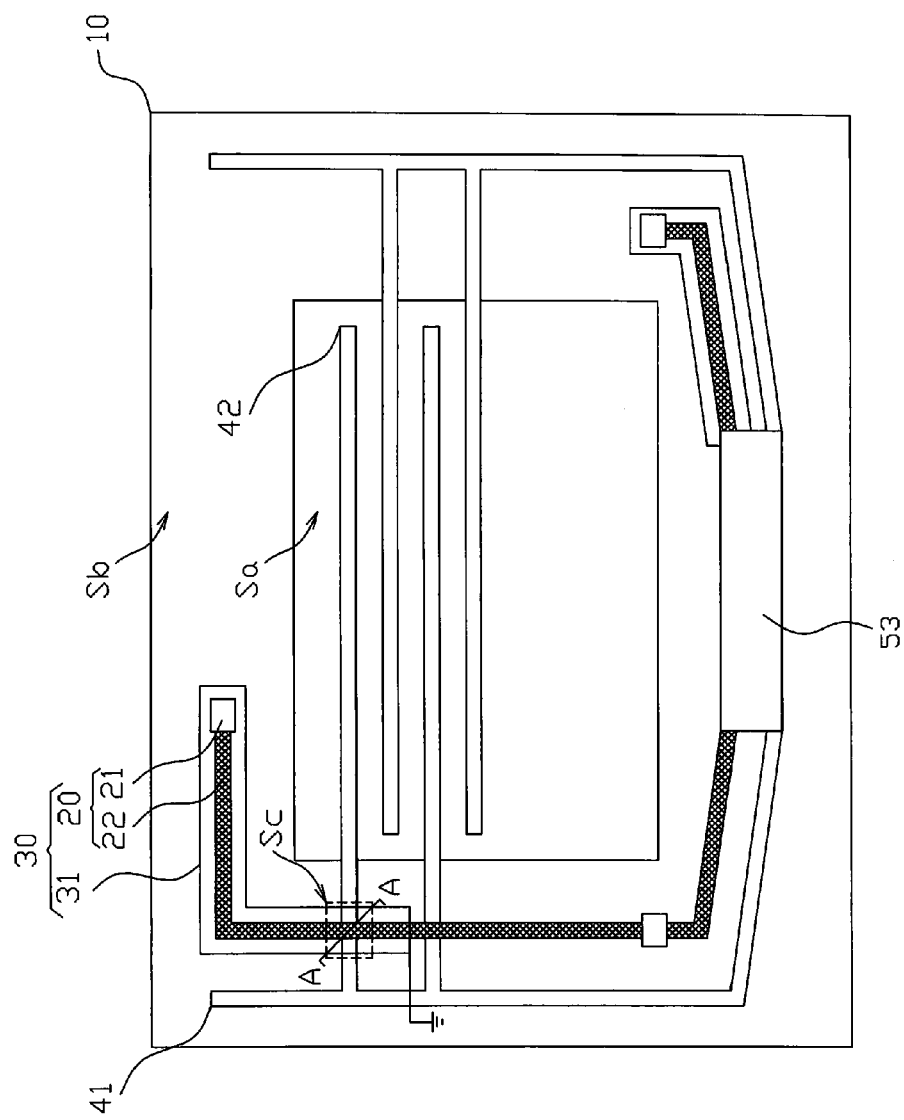
FIG. 2 shows a top-view illustrating a substrate of the display device according to another embodiment of the invention.
Figure 3:
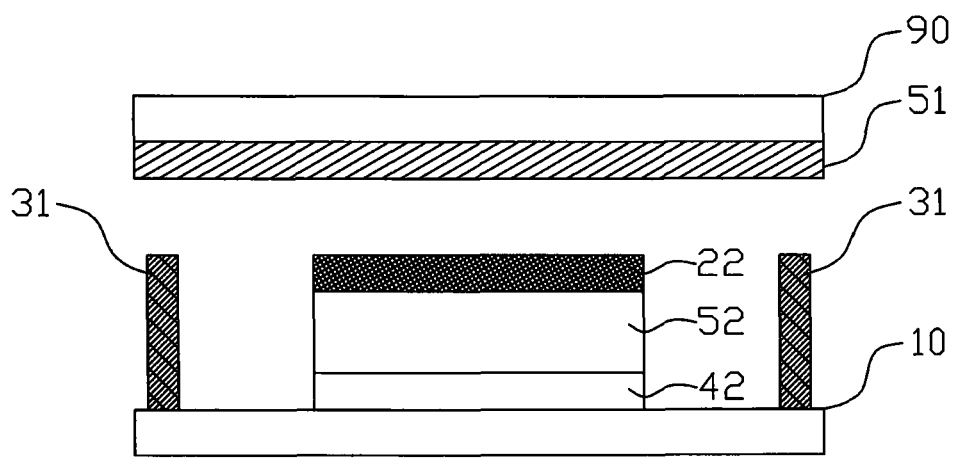
FIG. 3 shows a cross-section illustrating the display device according to one embodiment of the invention along the A-A line shown in FIG. 2.

FIG. 2 shows a top-view illustrating a substrate of the display device according to another embodiment of the invention. FIG. 3 shows a cross-section cut along the A-A line shown in FIG. 2. The embodiment shown in FIG. 2 is similar to that shown in FIG. 1. The following only describes the differences between the two embodiments. In this embodiment, the display device 11 comprises an active matrix substrate 10 and a color filter substrate 90 facing the active matrix substrate 10. The protection wiring 31 is grounded through another circuit, and the display device 11 further comprises a first insulation layer 52 and a second circuit. The second circuit may be a second common wiring 42. The second common wiring 42 is provided on the active matrix substrate 10. In addition, the second common wiring 42 is coupled to the first common wiring 41 provided in the non-active display region Sb and extends to the active display region Sa. The second common wiring 42 crosses the photo sensing signal line 22 via the first insulation layer 52 to form an overlapping region Sc. Generally, the thickness of the first insulation layer 52 is about 3000 Å. In this embodiment, the thickness of the first insulation layer 52 in the overlapping region Sc is set between about 5000 Å and 6000 Å, in order to reduce the interference from the second common wiring 42. Thus, the precision and the stability of sensing results of the photo sensing device 20 is increased. Besides, the protection wiring may have, but not limited to, the same layout as that shown in FIG. 1.

Figure 4:
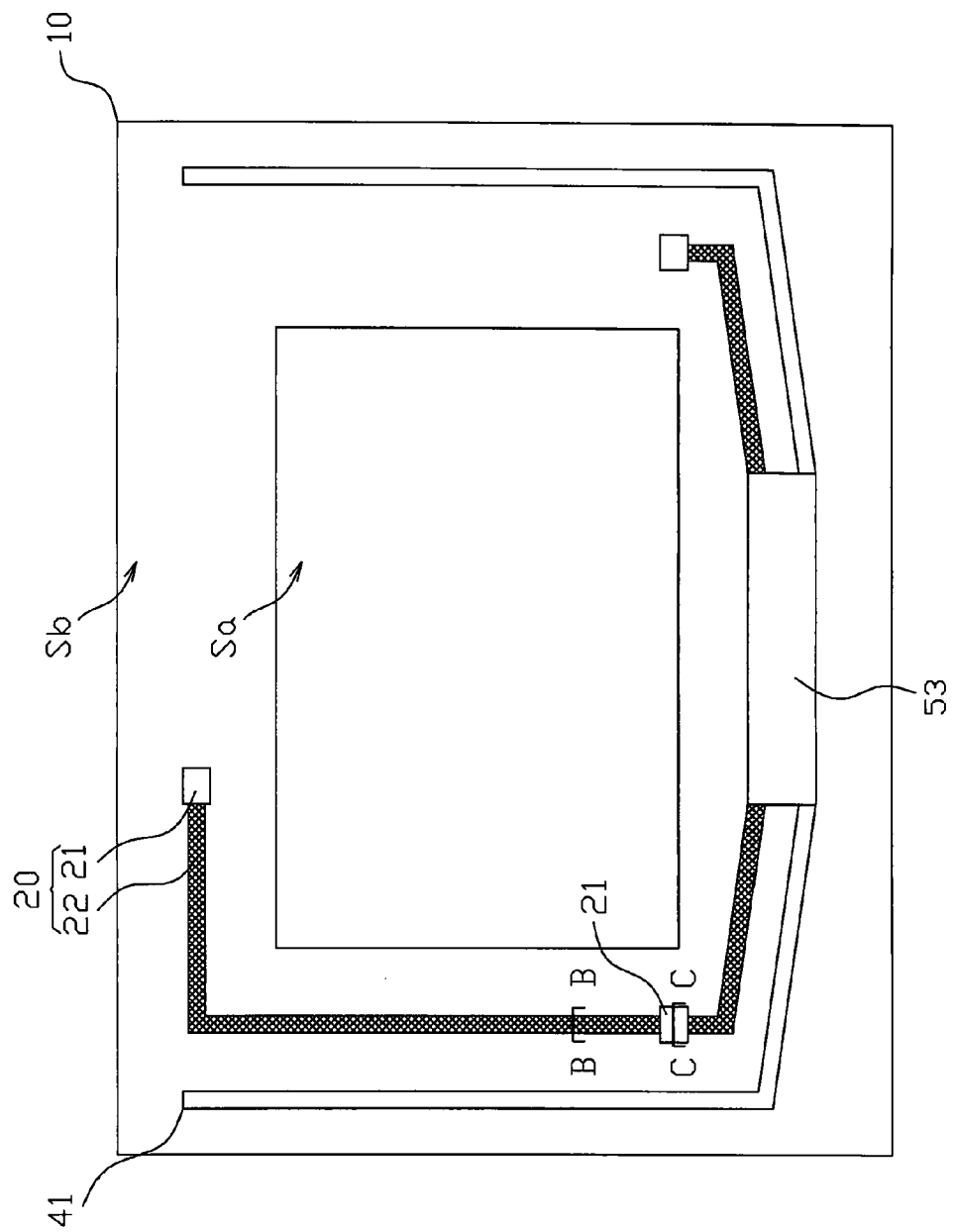
FIG. 4 shows a top-view illustrating a substrate of the display device according to another embodiment of the invention.
Figure 5A:
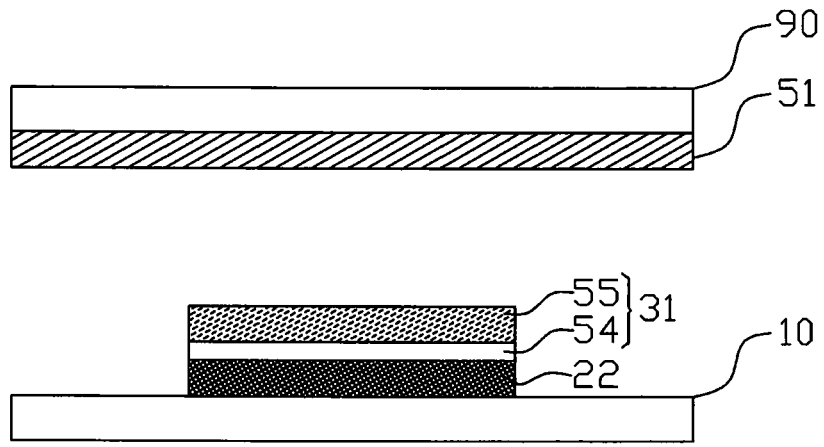
FIG. 5A shows a cross-section illustrating the display device according to one embodiment of the invention along the B-B line shown in FIG. 4.
Figure 5B:
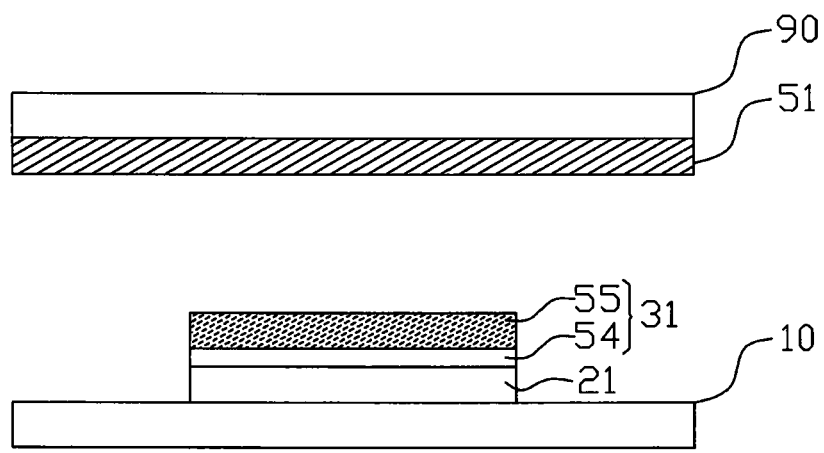
FIG. 5B shows a cross-section illustrating the display device according to one embodiment of the invention along the C-C line shown in FIG. 4.

FIG. 4 shows a top-view illustrating a substrate of the display device according to another embodiment of the invention. FIG. 5A shows a cross-section cut along the B-B line shown in FIG. 4, and FIG. 5B shows a cross-section cut along the C-C line shown in FIG. 4. Referring to FIG. 4, FIG. 5A, and FIG. 5B, in this embodiment, the display device 11 comprises an active matrix substrate 10 and a color filter substrate 90 facing the active matrix substrate 10. The color filter substrate 90 is provided with a common electrode 51, and the common electrode 51 is regarded as an external circuit to the photo sensing device 20. Thus, the common electrode 51 imposes interference signals on the photo sensing device 20. The protection wiring 31 is provided on the photo sensor 21 or the photo sensing signal line 22 of the photo sensing device 20, so that a portion of the protection wiring 31 is located between the common electrode 51 and the photo sensor 21, as shown in FIG. 5B, and that another portion of the protection wiring 31 is located between the common electrode 51 and the photo sensing signal line 22, as shown in FIG. 5A. The protection wiring 31 is electrically-conductive and positioned between the common electrode 51 and the photo sensing device 20 to provide shielding effect, thus reducing the interference caused by the common electrode 51 and imposed on the photo sensing device 20. Thus, the precision and the stability of sensing results of the photo sensing device 20 is increased. In addition, one terminal of the protection wiring 31 may be coupled to one ground of the driver 53 (not shown).

In this embodiment, the protection wiring 31 may comprise an electrically-conductive wiring 55 and a second insulation layer 54. The second insulation layer 54 is positioned between the electrically-conductive wiring 55 and the photo sensor 22 of the photo sensing device 20, as shown in FIG. 5B, or between the electrically-conductive wiring 55 and the photo sensing signal line 22 of the photo sensing device 20, as shown in FIG. 5A. The electrically-conductive wiring 55 may be a metallic layer or an indium tin oxide (ITO) layer.

Figure 6:
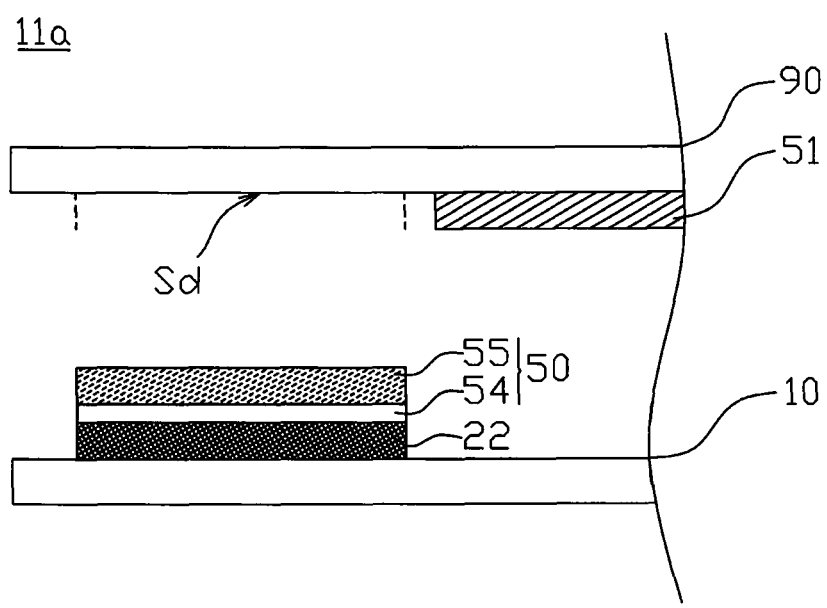
FIG. 6 shows a cross-section illustrating the display device according to another embodiment of the invention along the B-B line shown in FIG. 4.

FIG. 6 shows a cross-section cut along the B-B line shown in FIG. 4. The embodiment shown in FIG. 6 is similar to that shown in FIGS. 5A and 5B. The following only describes the differences between the two embodiments. In this embodiment, the photo sensing signal line 22 (or photo sensor 21) of the photo sensing device 20 is provided in a specific region of the active matrix substrate 10 so that the photo sensing signal line 22 (or photo sensor 21) of the photo sensing device 20 forms projection region Sd on the color filter substrate 90 along the normal of the active matrix substrate 10. The projection region Sd is not overlapped with the common electrode 51. By this design, the photo sensing signal line 22 of the photo sensing device 20 and the common electrode 51 are separated from each other to further reduce the interference from the common electrode 51 and imposed on the photo sensing device 20. Besides, since the photo sensing signal line 22 and the common electrode 51 are spaced apart from each other, the second insulation layer 54 and the electrically-conductive wiring 55 may be omitted but still achieve the effect of reducing the interference caused by the common electrode.

Although the present invention has been fully described by the above embodiments, the embodiments should not constitute the limitation of the scope of the invention. Various modifications or changes can be made by those who are skilled in the art without deviating from the spirit of the invention.

What is claimed is:

1. A display device, comprising:
    an active matrix substrate;
    a color filter substrate provided opposite the active matrix substrate;
    a first circuit provided on the color filter substrate;
    a photo sensing device provided on the active matrix substrate and comprising a photo sensor and a photo sensing signal line coupled to the photo sensor;
    an electrically-conductive protection wiring provided between the first circuit and at least a portion of the photo sensing device;
    a second circuit provided on the active matrix substrate, wherein the second circuit crosses the photo sensing signal line to form an overlapping region; and
    an insulation layer at least disposed in the overlapping region and between the second circuit and the photo sensing signal line.

2. The display device according to claim 1, wherein the protection wiring is provided on the active matrix substrate and surrounds at least one of the photo sensor and the photo sensing signal line.

3. The display device according to claim 1, further comprising:
    a driver provided on the active matrix substrate and coupled to the first circuit and the photo sensing device.

4. The display device according to claim 3, wherein the protection wiring is coupled to a ground of the driver.

5. The display device according to claim 4, wherein the active matrix substrate is divided into an active display region and a non-active display region, and the photo sensing device and the protection wiring are provided on the non-active display region.

6. The display device according to claim 1, wherein a thickness of the insulation layer in the overlapping region is between 5000 Å and 6000 Å.

7. The display device according to claim 6, wherein the first circuit and the second circuit are coupled to a common electrode.

8. A display device, comprising:
    an active matrix substrate;
    a color filter substrate provided opposite the active matrix substrate;
    a common electrode provided on the color filter substrate;
    a photo sensing device provided on the active matrix substrate and comprising a photo sensor and a photo sensing signal line coupled to the photo sensor, wherein the photo sensing device is not overlapped with the common electrode on the color filter substrate; and
    a protection wiring disposed on at least one of the photo sensor and the photo sensing signal line.

9. The display device according to claim 8, wherein the protection wiring comprises an electrically-conductive wiring and an insulation layer, and the insulation layer is provided between the electrically-conductive wiring and the photo sensing device.

10. The display device according to claim 9, wherein the electrically-conductive wiring comprises a metallic layer or an indium tin oxide layer.

* * * * *